(12) United States Patent
Redd et al.

(10) Patent No.: US 6,372,414 B1
(45) Date of Patent: Apr. 16, 2002

(54) LIFT-OFF PROCESS FOR PATTERNING FINE METAL LINES

(75) Inventors: Randy D. Redd, Chandler, AZ (US); Ralph R. Dammel, Flemington, NJ (US); John P. Sagan, Blairstown, NJ (US); Mark A. Spak, Edison, NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/268,438

(22) Filed: Mar. 12, 1999

(51) Int. Cl.$^7$ .............................. G03F 7/26; G03F 7/32
(52) U.S. Cl. ..................... 430/327; 430/322; 430/326; 430/329; 430/330; 430/331; 430/464
(58) Field of Search ............................... 430/322, 326, 430/327, 329, 330, 331, 464

(56) References Cited

U.S. PATENT DOCUMENTS

| | | | | |
|---|---|---|---|---|
| 3,961,100 A | * | 6/1976 | Harris | 427/43 |
| 4,873,177 A | | 10/1989 | Tanaka et al. | 430/324 |
| 4,914,006 A | | 4/1990 | Kato et al. | 430/331 |
| 5,069,996 A | * | 12/1991 | Rogler | 430/168 |
| 5,236,810 A | * | 8/1993 | Kondo | 430/313 |
| 5,252,436 A | | 10/1993 | Binder et al. | 430/324 |
| 5,436,114 A | * | 7/1995 | Itoo | 430/311 |
| 5,849,467 A | * | 12/1998 | Sato | 430/327 |

FOREIGN PATENT DOCUMENTS

| | | | |
|---|---|---|---|
| JP | 60-32047 | * | 2/1985 |
| JP | JP1019344 | | 1/1989 |
| JP | 3-235322 | * | 10/1991 |
| JP | 9-147429 | * | 6/1997 |

OTHER PUBLICATIONS

NA 83123115, "Single–Step Lift–Off Process", Dec. 1983, IBM Technical Disclosure, vol. 26, No. 7A, p. 3115.*
NN 79091399, "Single Layer Lift–Off Process", Sep. 1979, IBM Technical Disclosure, vol. 22, No. 4, p. 1399.*
PCT Search Report–mailing date May 25, 2000.

* cited by examiner

*Primary Examiner*—Mark F. Huff
*Assistant Examiner*—Nicole Barreca
(74) *Attorney, Agent, or Firm*—Krishna G. Banerjee

(57) ABSTRACT

The present invention relates to a process for providing a pattern on a substrate for use in a metal lift-off process, the process comprising: 1) coating a substrate with a liquid positive photoresist; 2) soft baking the coated substrate; 3) contacting the substrate with an aqueous alkaline developer containing from about 0.005 volume percent to about 0.05 volume percent of an alkylene glycol alkyl ether; 4) placing a patterned mask over the substrate; 5) exposing the substrate through the mask; 6) post exposure baking the substrate; 7) optionally, flood exposing the substrate; and 8) developing the substrate with an aqueous alkaline developer. The invention also relates to a novel developer solution of an ammonium hydroxide containing from about 0.005 volume percent to about 0.5 volume percent of an alkylene glycol alkyl ether and to a process for producing such a novel developer solution.

7 Claims, No Drawings

LIFT-OFF PROCESS FOR PATTERNING FINE METAL LINES

BACKGROUND OF THE INVENTION

The present invention relates to a single photoresist layer lift-off process for forming patterned metal layers on a suitable substrate. The present process produces a patterned photoresist layer having excellent photoresist profile overhang and a negative slope in the sidewalls of the photoresist profile, both of which help to increase productivity by reducing production time.

Metal pattern formation is a key process for the fabrication of integrated circuits. Two etching methods have been utilized for many years. The first to be developed was the wet etching process. Dry etching was developed later. With the increase in knowledge about the role of metals in enhancing the performance of integrated circuits, more metallic materials are being applied and utilized in the fabrication of integrated circuits. Lift-off techniques were proposed several years ago to eliminate the drawbacks inherent to both wet and dry etching. Such lift-off processes eliminate the necessity for optimization of etch selectivity between metal, photoresist and substrate. They also eliminate the many difficulties involved with patterning over reflective topographies on the surface of the substrate. Almost any metal, metal alloy or metal composition can then be deposited on the photoresist film. Therefore, metals can then be selected based on their electromigration or other performance considerations, rather than on the basis of etch selectivity. In addition, other drawbacks, such as silicon residues remaining in the field between the conductors, conductors wide reduction due to the lateral etch, and space increase between adjacent conductors in a wet etch, are eliminated. In the lift-off process the formation of sidewalls with a negative slope is the key step.

The lift-off process is in contrast to the typical process using of a photoresist and a mask whereby the areas of desired metallization are protected and the other areas remain exposed and are etched away. In a lift-off process the substrate is covered with a thin film of a photoresist in all areas except where metallization is desired. The metal is then deposited and covers the entire substrate with the metal layer on top of the photoresist and in contact with the surface of the substrate in the areas unprotected by the photoresist. The photoresist is then removed and the unwanted metal layer is lifted off of the substrate. Only the desired metal pattern is left behind on the surface of the substrate.

A lift-off process for patterning metal lines on a substrate allows one to eliminate or minimize the need for using a chemical or plasma etching when such a process step would be either undesirable or incompatible with the process or the materials being used. In the processing of Gallium Arsenide (GaAs) substrates, the typical metallization process requires the use of a metal composite to form the metal contacts and transmission lines. Typical metals that are utilized in such processes include aluminum, gold, nickel, chromium, platinum, tantalum and titanium. The required structure may use two or three layers of these metals, frequently in combination. Chemically etching these metals would require very strong and harsh chemicals that would also attack the GaAs substrate and degrade the performance of the resulting microelectronic device.

When tight line width control is required a lift-off process is frequently utilized. A wet chemical etch is normally isotropic in nature. Because of deviations related to processing, metal films frequently have variations across the substrate in the thickness of the deposited layer. Such film thickness variations require the substrate (e.g. a wafer) to be etched for a longer period of time to assure that complete etching has taken place. This results in the line width being reduced when the isotropic chemical etch works under the photoresist mask. The most extreme instances of this are when the film thickness is at a minimum. However, the lift-off process depends overwhelmingly on the control of the photoresist. Therefore, a consistent line width is maintained independently of variations in the thickness of the metal layer or variations in the etch process.

A typical lift-off process disclosed in the prior art using a positive photoresist composition comprises: 1) coating a single layer of a photoresist on a suitable substrate, 2) heat treating the coated substrate to adhere the photoresist to the surface of the substrate, 3) immersing the heat treated substrate in a bath of an aromatic solvent such as chlorobenzene, 4) again heat treating the coated substrate, 5) exposing the photoresist layer to actinic radiation in the shape of a desired pattern, 6) developing the exposed photoresist layer to remove unexposed portions and thereby forming the shape of the desired pattern in the photoresist layer, 7) depositing a metal layer over the patterned photoresist layer and exposed substrate surface, 8) immersing the substrate in a solvent bath to remove the photoresist layer and the metal layer deposited on the photoresist layer while leaving a pattern of deposited metal on the surface of the substrate.

U.S. Pat. No. 4,814,258 relates to a metal lift-off process utilizing a GaAs substrate having a planarization layer of polydimethyl glutarimide (PMGI) juxtaposed to the surface of the GaAs substrate and a photoresist layer adjacent to the PMGI planarization layer. The process disclosed comprises: 1) soaking the photoresist layer and PGMI planarization layer with a solvent to thereby decrease the solubility of the photoresist layer and enhance the solubility of the PGMI planarization layer, 2) develop the PMGI planarization layer, thereby forming an undercut profile between the planarization layer and the photoresist layer. In a preferred embodiment of this prior art process, the development step is carried out by flood exposing the substrate to nominal light with the photoresist layer having positive masking characteristics in relation to the PMGI planarization layer.

SUMMARY OF THE INVENTION

The present invention relates to an improved process for providing a pattern on a suitable substrate for use in a single level metal lift-off process for producing metal patterns on a suitable substrate, such as a Gallium Arsenide or silicon wafer. The subject process comprises:

1) coating a suitable substrate with a layer of a liquid positive photoresist;
2) soft baling the coated substrate from step 1 to substantially remove photoresist solvent from the photoresist layer,
3) contacting the photoresist layer on the soft baked coated substrate from step 2 with an aqueous alkaline developer, preferably an ammonium hydroxide developer, more preferably a tetramethyl ammonium hydroxide (TMAH) developer, and most preferably a tetramethyl ammonium hydroxide developer containing from about 0.005 volume percent to 0.5 volume percent of an C1–C4 alkylene glycol alkyl ether, preferably a propylene glycol alkyl ether such as propylene glycol methyl ether;
4) placing a mask containing a pattern over the photoresist layer on the soft baked coated substrate from step 3;

5) exposing portions of the photoresist layer to actinic radiation, such as i-line, on the soft baked coated substrate from step 3 through the mask from step 4;
6) post-exposure baking the photoresist layer on the soft baked coated substrate from step 5; and
7) optionally, flood exposing the photoresist layer on the soft baked coated substrate from step 6 to actinic radiation,, such as with broad band illumination;
8) developing the photoresist layer on the coated substrate from step 6 or 7 with an aqueous alkaline developer, such as an ammonium hydroxide, preferably a tetramethyl ammonium hydroxide developer.

In step 1, the positive photoresist is preferably deposited onto a spinning substrate, such as a gallium arsenide or silicon wafer. The preferred spinning speed is from about 1,000 rpm to about 6,000 rpm, more preferably from about 2,000 rpm to about 5,000 rpm. The soft baking in step 2 is preferably carried out at as low a temperature as possible, from about 45° C. to about 75° C., more preferably from about 50° C. to about 60° C., most preferably from about 55° C. to about 60° C. for a period of from about 60 seconds to about 180 seconds, preferably from about 60 seconds to about 120 seconds.

The present process provides profiles having sidewalls with a substantial negative slope at the top of the photoresist sidewall, which allows a metal deposition process wherein there is substantially no metal deposited on the sidewalls. This ensures that there are clear discontinuities between the metal to be removed and the metal that remains and provides the conductive metal patterns on the substrate. This also eliminates excess metal deposits that would be in addition to the smooth metal profile that is most desirable.

The present invention also provides an improved aqueous developer solution of an ammonium hydroxide, preferably a tetramethyl ammonium hydroxide, in water where the developer solution contains from about 0.005 volume percent to about 0.5 volume percent of an C1–C4 alkylene glycol C1–C4 alkyl ether, preferably a propylene glycol alkyl ether such as a propylene glycol methyl ether and a method of producing such a developer. This process comprises:

1) providing a developer solution of an aqueous alkaline compound, preferably ammonium hydroxide, most preferably a tetramethyl ammonium hydroxide, in water, preferably from about 0.20 to about 0.30 Normal ("N"); and
2) mixing the developer solution from step 1 with a C1–C4 alkylene glycol C1–C4 alkyl ether in an amount sufficient to provide a developer solution containing from about 0.005 volume percent to about 0.5 volume percent of said C1–C4 alkylene glycol C1–C4 alkyl ether.

The claimed invention is illustrated by the following examples:

EXAMPLE 1

995 ml. of an aqueous developer solution of tetramethyl ammonium hydroxide in water (0.261N AZ® 300 MIF Developer available Clariant Corp.) was provided. 5 ml. of propylene glycol methyl ether (PGME) was also provided. The PGME was mixed with the 300 MIF developer. The resulting developer solution contained 0.5 volume percent PGME.

EXAMPLE 2

1 volume of the developer solution produced in Example 1 was mixed with 9 volumes of 0.261 N AZ® 300 MIF Developer. The resulting developer solution contained 0.05 volume percent PGME.

EXAMPLE 3

1 volume of the developer solution produced in Example 2 was mixed with 9 volumes of 0.261N AZ® 300 MIF Developer. The resulting developer solution contained 0.005 volume percent PGME.

EXAMPLE 4

A 4-inch hexamethyldisilazane (ADS) primed gallium arsenide wafer was coated at 3500 rpm with AZ® 7908 liquid photoresist (available from Clariant Corp.) to a film thickness of 0.90 micrometers. The coated wafer was then soft baked at 90° C. for 60 seconds on a hot plate. The soft baked wafer was then immersed for 2 minutes in the developer produced according to the procedure of Example 1 (Soak Step). The coated wafer was then exposed on a 0.54 NA I-line stepper at a 300 millijoule/sq. cm. (mJ) dose, using a resolution test reticle. The exposed wafer was then post exposure baked (PEBed) on a hot plate for 45 seconds at 145° C. The wafer was then immersed in an AZ® 300 MIF Developer solution for 2 minutes, rinsed with deionized (DI) water and dried. Observation of a scanning electron micrograph (SEM) photograph of the nominal 0.5 micrometer isolated space revealed a 0.16 micrometer overhang on each sidewall of the profiles.

EXAMPLE 5

A 4-inch hexamethyldisilazane (HMDS) primed gallium arsenide wafer was coated at 3500 rpm with AZ® 7908 liquid photoresist (available from Clariant Corp.) to a film thickness of 0.90 micrometers. The coated wafer was then soft baked at 90° C. for 60 seconds on a hot plate. The soft baked wafer was then immersed 2 minutes in the developer produced according to the procedure of Example 3. The coated wafer was then exposed on a 0.54 NA I-line stepper at a 340 millijoule/sq. cm. (mJ) dose, using a resolution test reticle. The exposed wafer was then post exposure baked (PEBed) in an oven for 45 seconds at 145° C. The PEBed wafer was then flood exposed with a Perkin Elmer™ Aligner (which produces broad band illumination covering the wavelengths between 365 and 436 nanometers [nm]) at an 80 mJ dose. The wafer was then immersed in an AZ® 300 MIF Developer solution for 1 minute, rinsed with deionized (DI) water and dried. Observation of a scanning electron micrograph (SEM) photograph of the nominal 0.5 micrometer isolated space revealed a 0.25 micrometer overhang on each sidewall of the profiles.

EXAMPLE 6

A 4-inch hexamethyldisilazane (HMDS) primed gallium arsenide wafer was coated at 3500 rpm with AZ® 7908 liquid photoresist (available from Clariant Corp.) to a film thickness of 0.90 micrometers. The coated wafer was then soft baked at 90° C. for 60 seconds on a hot plate. The soft baked wafer was then immersed for 2 minutes in the developer produced according to the procedure of Example 1. The coated wafer was then exposed on a 0.54 NA I-line stepper at a 300 millijoule/sq. cm. (mJ) dose, using a resolution test reticle. The exposed wafer was then post exposure baked (PEB) in an oven for 45 seconds at 145° C. The wafer was then immersed in an AZ® 300 MIF Developer solution for 2 minutes, rinsed with deionized (DI) water and dried. Observation of a scanning electron micrograph (SEND photograph of the nominal 0.5 micrometer isolated space revealed a 0.09 micrometer overhang on each sidewall of the profiles.

Comparative Example 7

The procedure of Example 4 was repeated with no Soak Step or Flood Exposure. Observation of a scanning electron micrograph (SEM) photograph of the nominal 0.5 micrometer isolated space revealed no measurable overhang on any of the sidewalls of the profiles.

Having described our invention, what we desire to claim is:

1. A method for producing a pattern on a suitable substrate suitable for forming a sub-micron width metal line on a suitable substrate, the process comprising:
   1) coating the substrate with a single layer of a liquid positive photoresist;
   2) soft baking the coated substrate from step 1 to substantially remove photoresist solvent from the photoresist layer;
   3) contacting the photoresist layer on the substrate from step 2 with an aqueous alkaline developer containing from about 0.005 volume percent to 0.5 volume percent of an C1–C4 alkylene glycol C1–C4 alkyl ether;
   4) placing a mask containing a pattern over the photoresist layer on the substrate from step 3;
   5) exposing portions of the photoresist layer to actinic radiation, on the substrate from step 3, through the mask from step 4;
   6) post-exposure baking the photoresist layer on the substrate from step 5; and
   7) optionally, flood exposing with actinic radiation the photoresist layer on the substrate from step 6;
   8) developing the photoresist layer on the substrate from step 6 or 7 with an aqueous alkaline developer, and thereby producing on the substrate a pattern having sidewalls with a substantial negative slope at the top of the photoresist sidewall.

2. The method of claim 1 wherein in step 3 the aqueous alkaline developer is an ammonium hydroxide developer.

3. The method of claim 1 wherein in step 3 the aqueous alkaline developer is a tetramethyl ammonium hydroxide developer.

4. The method of claim 1 wherein in step 3 the C1–C4 alkylene glycol C1–C4 alkyl ether is a propylene glycol C1–C4 alkyl ether.

5. The method of claim 1 wherein in step 3 the C1–C4 alkylene glycol C1–C4 alkyl ether is a propylene glycol methyl ether.

6. The method of claim 1 wherein in step 8 the aqueous alkaline developer is an ammonium hydroxide.

7. The method of claim 1 wherein in step 8 the aqueous alkaline developer is a tetramethyl ammonium hydroxide.

* * * * *